(12) United States Patent
Gill et al.

(10) Patent No.: US 9,019,667 B2
(45) Date of Patent: Apr. 28, 2015

(54) PROTECTION DEVICE AND RELATED FABRICATION METHODS

(71) Applicant: Freescale Semiconductor Inc., Austin, TX (US)

(72) Inventors: Chai Ean Gill, Chandler, AZ (US); Changsoo Hong, Phoenix, AZ (US); Rouying Zhan, Gilbert, AZ (US); William G. Cowden, Gilbert, AZ (US)

(73) Assignee: Freescale Semiconductor Inc., Austin, TX (US)

( * ) Notice: Subject to any disclaimer, the term of this patent is extended or adjusted under 35 U.S.C. 154(b) by 128 days.

(21) Appl. No.: 13/671,623

(22) Filed: Nov. 8, 2012

(65) Prior Publication Data

US 2014/0126091 A1    May 8, 2014

(51) Int. Cl.
*H01L 21/8222* (2006.01)
*H02H 9/04* (2006.01)

(52) U.S. Cl.
CPC ........... *H02H 9/044* (2013.01); *H01L 21/8222* (2013.01)

(58) Field of Classification Search
USPC ............. 361/56; 257/173, 106, 565, 566, 370
See application file for complete search history.

(56) References Cited

U.S. PATENT DOCUMENTS

| | | | |
|---|---|---|---|
| 7,696,580 B2 * | 4/2010 | Chen et al. ................... | 257/370 |
| 7,701,012 B2 | 4/2010 | Xu et al. | |
| 7,723,823 B2 * | 5/2010 | Gill et al. ...................... | 257/565 |
| 7,935,605 B1 * | 5/2011 | Vashchenko et al. ......... | 438/328 |
| 7,973,386 B1 * | 7/2011 | Vashchenko et al. ......... | 257/565 |
| 8,304,838 B1 * | 11/2012 | Chen et al. .................... | 257/370 |
| 8,743,516 B2 * | 6/2014 | Gill et al. ....................... | 361/56 |
| 2009/0033304 A1 * | 2/2009 | Benedict ........................ | 323/284 |
| 2009/0057833 A1 * | 3/2009 | Renaud et al. ................ | 257/577 |
| 2009/0115018 A1 | 5/2009 | Mallikarjunaswamy | |
| 2009/0195944 A1 * | 8/2009 | Goyal et al. .................... | 361/56 |
| 2009/0213506 A1 * | 8/2009 | Zhan et al. ..................... | 361/56 |
| 2010/0244088 A1 * | 9/2010 | Whitfield et al. ............. | 257/106 |
| 2010/0301389 A1 * | 12/2010 | Kushner et al. ............... | 257/173 |
| 2011/0176244 A1 | 7/2011 | Gendron et al. | |
| 2012/0068299 A1 * | 3/2012 | Lin et al. ........................ | 257/510 |
| 2012/0162831 A1 * | 6/2012 | Wang et al. .................... | 361/56 |
| 2012/0295414 A1 * | 11/2012 | Zhan et al. .................... | 438/400 |

* cited by examiner

*Primary Examiner* — Thienvu Tran
*Assistant Examiner* — Angela Brooks
(74) *Attorney, Agent, or Firm* — Ingrassia Fisher & Lorenz, P.C.

(57) ABSTRACT

Protection device structures and related fabrication methods are provided. An exemplary protection device includes a first bipolar junction transistor, a second bipolar junction transistor, a first zener diode, and a second zener diode. The collectors of the first bipolar junction transistors are electrically coupled. A cathode of the first zener diode is coupled to the collector of the first bipolar transistor and an anode of the first zener diode is coupled to the base of the first bipolar transistor. A cathode of the second zener diode is coupled to the collector of the second bipolar transistor and an anode of the second zener diode is coupled to the base of the second bipolar transistor. In exemplary embodiments, the base and emitter of the first bipolar transistor are coupled at a first interface and the base and emitter of the second bipolar transistor are coupled at a second interface.

20 Claims, 10 Drawing Sheets

PROTECTION DEVICE AND RELATED FABRICATION METHODS

TECHNICAL FIELD

Embodiments of the subject matter described herein relate generally to electronic devices, and more particularly, to electrostatic discharge protection devices and related fabrication methods.

BACKGROUND

Modern electronic devices, and particularly, integrated circuits, are at risk of damage due to electrostatic discharge (ESD) events. During an ESD event, a voltage may be provided to one or more terminals of an electronic device that exceeds the design voltage of the device, which could impair subsequent operation of the device. For example, a voltage at a terminal of an electronic device during an ESD event may exceed the breakdown voltage of one or more components of the device, and thereby potentially damage those components. Accordingly, electronic devices include discharge protection circuitry that provides protection from excessive voltages across electrical components during ESD events. However, existing discharge protection circuitry may be susceptible to latchup or otherwise exhibit snapback behavior, where parasitics within the discharge protection circuitry continue to conduct current at the design voltage, and thereby impair the functionality of the discharge protection circuitry after an ESD event.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures, which are not necessarily drawn to scale.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

Embodiments of the subject matter described herein relate to electrostatic discharge (ESD) protection devices and related circuitry that are less susceptible to latchup by reducing the voltage differential between the triggering voltage and the snapback voltage of an ESD clamping circuit. As used herein, the triggering voltage should be understood as referring to the threshold voltage differential applied to input/output interfaces of an electronic device that causes the ESD clamp to begin conducting current when the applied voltage exceeds the triggering voltage, while the snapback voltage is the subsequent voltage differential applied to the input/output interfaces of the electronic device that causes the ESD clamp to stop conducting current when the applied voltage falls below that voltage. In this regard, when the difference between the triggering voltage and the snapback voltage is relatively small (i.e., the snapback voltage is substantially equal to the triggering voltage), the ESD clamp is effectively a non-snapback clamp or otherwise exhibits non-snapback behavior, because the ESD clamp effectively stops conducting current when the applied voltage falls below the triggering voltage. For example, when the snapback voltage is greater than the design voltage for an electronic device, the ESD clamp stops conducting current once the applied voltage returns to the design voltage without any power cycling. In some embodiments, the ESD protection devices described herein have a snapback voltage that is equal to the triggering voltage. Additionally, the ESD protection devices described herein are bidirectional and capable clamping voltages from ESD events with either polarity. Furthermore, the ESD protection devices may be fabricated on a silicon-on-insulator (SOI) substrate that provides vertical isolation that allows the ESD protection devices to be stacked vertically or otherwise cascoded and achieve the desired triggering voltage and/or snapback voltage.

Figure 1:
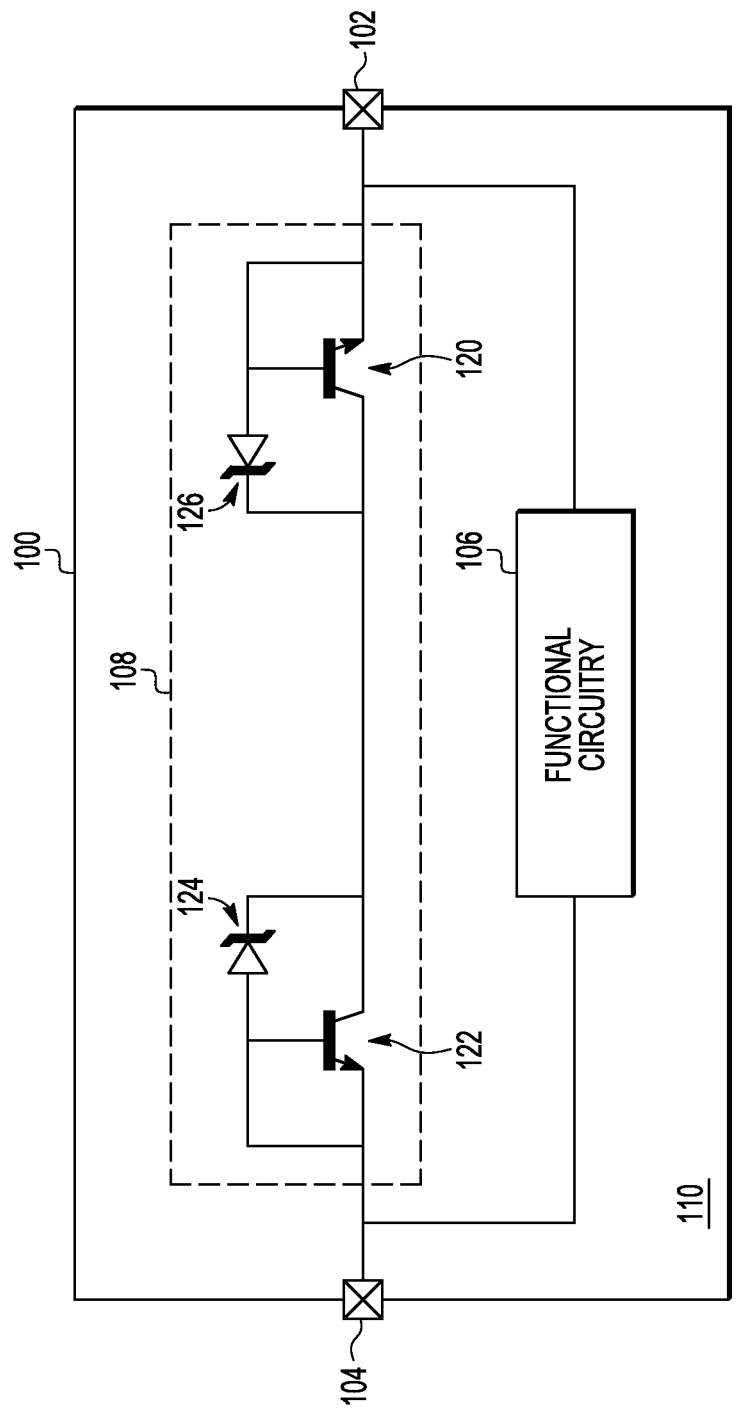
FIG. 1 is a schematic diagram of an exemplary electronic device in accordance with one embodiment of the invention.

Turning now to FIG. 1, an exemplary electronic device package 100 includes one or more package interfaces 102, 104, functional circuitry 106 coupled to the package interfaces 102, 104, and protection circuitry 108 coupled to the interfaces 102, 104. In exemplary embodiments, the functional circuitry 106 and the protection circuitry 108 are formed, fabricated, mounted, or otherwise provided on a substrate 110 and encapsulated in a common device package to obtain the electronic device 100. In this regard, in some embodiments, the substrate 110 may be realized as a common semiconductor substrate having both the functional circuitry 106 and the protection circuitry 108 fabricated thereon, while in other embodiments, the substrate 110 may be realized as a package substrate (e.g., a lead frame, circuit board, or the like) that the functional circuitry 106 and the protection circuitry 108 are soldered, affixed, or otherwise mounted to. It should be understood that FIG. 1 is a simplified representation of the electronic device 100 for purposes of explanation and ease of description, and FIG. 1 is not intended to limit the application or scope of the subject matter in any way. Thus, although FIG. 1 depicts direct electrical connections between components, alternative embodiments may employ intervening circuit elements and/or components while functioning in a substantially similar manner.

The package interfaces 102, 104 generally represent the physical input/output interfaces to/from the functional circuitry 106 encapsulated in the electronic device 100. Depending on the embodiment, each of the package interfaces 102, 104 may be realized as an individual pin, pad, lead, terminal, solder ball, or another suitable physical interface to the electronic device 100. In accordance with one or more embodiments, the design (or intended) voltage for the first package interface 102 is greater than the design voltage for the second package interface 104. For example, the first package interface 102 may be realized as a positive reference (or supply) voltage input to the electronic device 100 and the second package interface 104 is realized as a negative reference (or ground) voltage input to the electronic device 100. Accordingly, for purposes of explanation, but without limitation, the first package interface 102 may alternatively be referred to herein as the higher voltage terminal and the second package interface 104 may alternatively be referred to herein as the lower voltage terminal.

The functional circuitry 106 generally represents the components of the electronic device 100 configured to provide the desired functionality for the electronic device 100. In this regard, depending on the embodiment, the functional circuitry 106 may be realized as any suitable combination of processing circuitry (e.g., one or more processing cores, processors, controllers, microcontrollers, microprocessors, or the like), logic circuitry, discrete components, analog and/or digital components, or other hardware components and/or circuitry configured to provide the desired functionality for the electronic device 100. In an exemplary embodiment, the functional circuitry 106 is coupled to the package interfaces 102, 104 to receive a supply voltage that facilitates the desired operation of the functional circuitry 106.

Still referring to FIG. 1, the protection circuitry 108 is connected between the higher voltage terminal 102 and the lower voltage terminal 104 to protect the functional circuitry 106 from a voltage difference between the device terminals 102, 104 that exceeds breakdown voltages of the functional circuitry 106. In the illustrated embodiment, the protection circuitry 108 functions as an ESD voltage clamp that begins conducting current when the voltage difference between the device terminals 102, 104 exceeds a triggering voltage of the protection circuitry 108. In this regard, the triggering voltage of the protection circuitry 108 is chosen to be greater than the supply voltage (or another design voltage) for the functional circuitry 106 but less than a breakdown voltage of the functional circuitry 106. In this manner, the protection circuitry 108 conducts current when the voltage difference between the terminals 102, 104 exceeds the triggering voltage and thereby clamps the voltage difference that the functional circuitry 106 is exposed to, thereby reducing the likelihood of the functional circuitry 106 being exposed to a voltage difference that exceeds the breakdown voltage of the functional circuitry 106 during an ESD event.

In exemplary embodiments, the protection circuitry 108 includes a pair of bipolar junction transistor (BJT) elements 120, 122 and a pair of diode elements 124, 126. As illustrated, a first NPN bipolar transistor element 120 has an emitter electrode coupled to the higher voltage terminal 102, a base electrode coupled to the emitter electrode at the higher voltage terminal 102, and a collector electrode coupled to the collector electrode of the second NPN bipolar transistor element 122. As described in greater detail below, in exemplary embodiments, the collector electrodes of the bipolar transistor elements 120, 122 are realized using a common doped region, that is, the bipolar transistor elements 120, 122 share a common collector electrode region formed in a semiconductor substrate. The emitter electrode of the second bipolar transistor element 122 is coupled to the lower voltage terminal 104 and the base electrode of the second bipolar transistor element 122 is coupled to the emitter electrode at the lower voltage terminal 104. An anode of the second diode element 124 is coupled to the base electrode of the second bipolar transistor element 122 and a cathode of the second diode element 124 is coupled to the collector electrode of the second bipolar transistor element 122. In this manner, the second diode element 124 is connected between the collector and base electrodes of the second bipolar transistor element 122 to control what voltage at the collector electrode causes the second bipolar transistor element 122 to turn on, as described in greater detail below. Similarly, an anode of the first diode element 126 is coupled to the base electrode of the first bipolar transistor element 120 and a cathode of the first diode element 126 is coupled to the collector electrode of the first bipolar transistor element 120.

In exemplary embodiments, the diode elements 124, 126 are realized as zener diode elements such that protection circuitry 108 is bidirectional and conducts current in either direction between terminals 102, 104. In other words, the protection circuitry 108 conducts current from the higher voltage terminal 102 to the lower voltage terminal 104 when the voltage at the higher voltage terminal 102 exceeds the voltage at the lower voltage terminal 104 by more than a first triggering voltage and conducts current from the lower voltage terminal 104 to the higher voltage terminal 102 when the voltage at the lower voltage terminal 104 exceeds the voltage at the higher voltage terminal 102 by more than a second triggering voltage. For purposes of explanation, the triggering voltage differential for conducting current from the higher voltage terminal 102 to the lower voltage terminal 104 may alternatively be referred to herein as the forward triggering voltage and the triggering voltage differential for conducting current from the lower voltage terminal 104 to the higher voltage terminal 102 may alternatively be referred to herein as the reverse triggering voltage. The forward triggering voltage corresponds to the sum of the forward bias voltage of the first diode element 126 and the reverse bias (or avalanche breakdown) voltage of the second diode element 124, while the reverse triggering voltage corresponds to the sum of the forward bias voltage of the second diode element 124 and the reverse bias (or avalanche breakdown) voltage of the first diode element 126.

FIGS. 2-11 illustrate, in cross-section, methods for fabricating a protection device structure 200 suitable for use as the protection circuitry 108 in the electronic device 100 of FIG. 1 in accordance with exemplary embodiments. Various steps in the manufacture of semiconductor devices are well known and so, in the interest of brevity, many conventional steps will only be mentioned briefly herein or will be omitted entirely without providing the well-known process details. Furthermore, it should be appreciated that although the subject matter may be described herein in the context of NPN bipolar junction transistor elements, the subject matter is not intended to be limited to NPN bipolar junction transistor elements and may be implemented in an equivalent manner for PNP bipolar junction transistor elements (e.g., by interchanging the conductivities of the doped regions).

Figure 2:
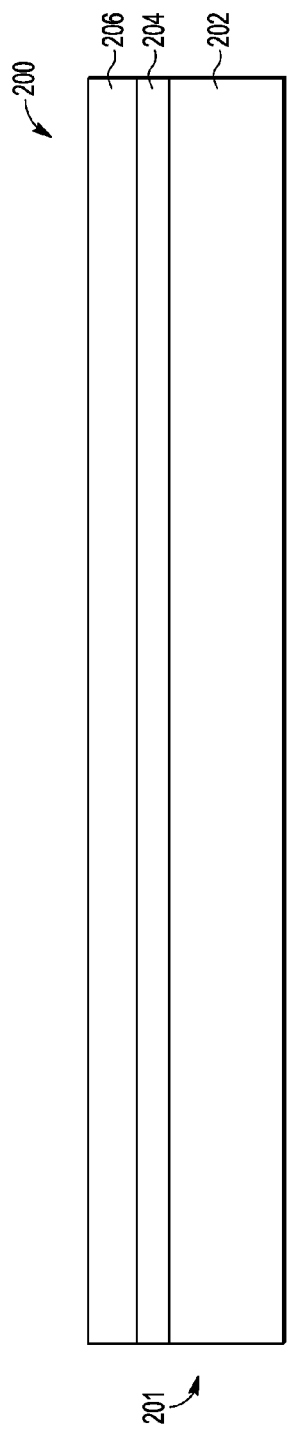
FIGS. 2-11 illustrate, in cross section, exemplary methods for fabricating a protection device structure suitable for use with the electronic device of FIG. 1 in accordance with one embodiment of the invention.

Referring to FIG. 2, in exemplary embodiments, the protection device structure 200 is fabricated on a semiconductor substrate, such as a SOI substrate 201 having a support (or handle) layer 202 of semiconductor material, an insulating layer 204 of dielectric material on or otherwise overlying the support layer 202, and a layer 206 of semiconductor material on or otherwise overlying the insulating layer 204. As described in greater detail below, in exemplary embodiments, the layer 206 of semiconductor material is utilized to epitaxially grow additional semiconductor material thereon, and accordingly, for convenience, but without limitation, the layer 206 of semiconductor material may alternatively be referred to herein as the seed layer. In an exemplary embodiment, the semiconductor material of each of the layers 202, 206 is realized as a silicon material, wherein the term "silicon material" is used herein to encompass the relatively pure silicon materials typically used in the semiconductor industry as well as silicon admixed with other elements such as germanium, carbon, and the like. Alternatively, one or more of the layers 202, 206 may be realized as germanium, gallium arsenide, and the like, and/or one or more of the layers 202, 206 may include layers of different semiconductor materials. In accordance with one embodiment, the insulating layer 204 is realized as an oxide layer formed in a subsurface region of the semiconductor substrate 201, also known as a buried oxide (BOX) layer. For example, the insulating layer 204 may be formed by oxidizing a wafer of semiconductor material (e.g., layer 206) which is then bonded to the support layer 202 to provide a buried layer of oxide material between the support layer 202 and the seed layer 206. In exemplary embodiments, the support layer 202 and the seed layer 206 are each lightly doped. For example, the seed layer 206 may be realized as a P-type silicon material having a P-type dopant concentration in the range of about $1\times10^{15}/cm^3$. Similarly, the support layer 202 may also be doped with the same (or different) conductivity-determining impurity type as the seed layer 206. In exemplary embodiments, the support layer 202 is realized as an N-type silicon material having a N-type dopant concentration in the range of about $1\times10^{15}/cm^3$. It should be understood that the fabrication process described herein is not constrained by the substrate of semiconductor material utilized, and the fabrication process described herein may also be used to create devices from a bulk semiconductor substrate.

Figure 3:
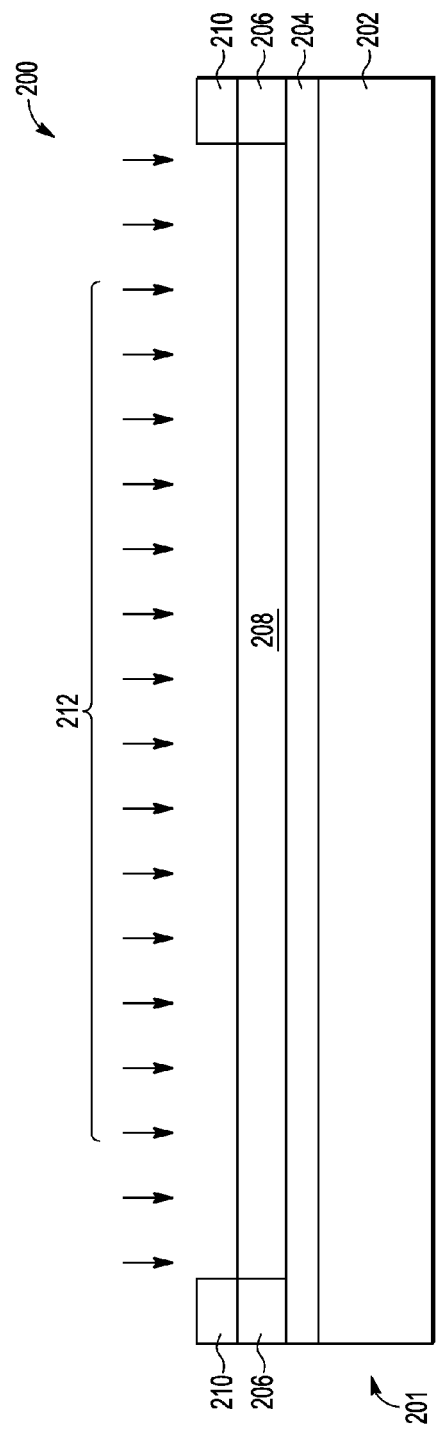

Referring to FIG. 3, in exemplary embodiments, fabrication of the protection device structure 200 continues by masking peripheral portions of the protection device structure 200 and forming a doped region 208 of semiconductor material within the seed layer 206 having a conductivity type that is opposite the conductivity of the seed layer 206. The doped region 208 is formed by masking the protection device structure 200 with a masking material 210, such as a photoresist material, that is patterned to provide an implantation mask that exposes the interior portion of the seed layer 206 to be used for the doped region 208. The doped region 208 is then formed by implanting N-type ions, such as antimony ions or phosphorous ions, illustrated by arrows 212, in the seed layer 206 with a dopant concentration in the range of about $1\times10^{16}/cm^3$ to about $1\times10^{19}/cm^3$ at an energy level in the range of about 50 kiloelectron volts (keV) to about 2000 keV. In the illustrated embodiment, the depth of the doped region 208 (after subsequent thermal annealing or any other diffusion) corresponds to the thickness of the seed layer 206 so that the doped region 208 extends to and abuts or otherwise contacts the insulating layer 204. For example, in accordance with one or more embodiments, the thickness of the seed layer 206 is within the range of about 1 micrometer (or micron) to about 4 microns (depending on the needs of a particular application), and the doped region 208 has a depth in the range of 1 micron to about 4 microns that corresponds to the thickness of the seed layer 206.

Figure 4:
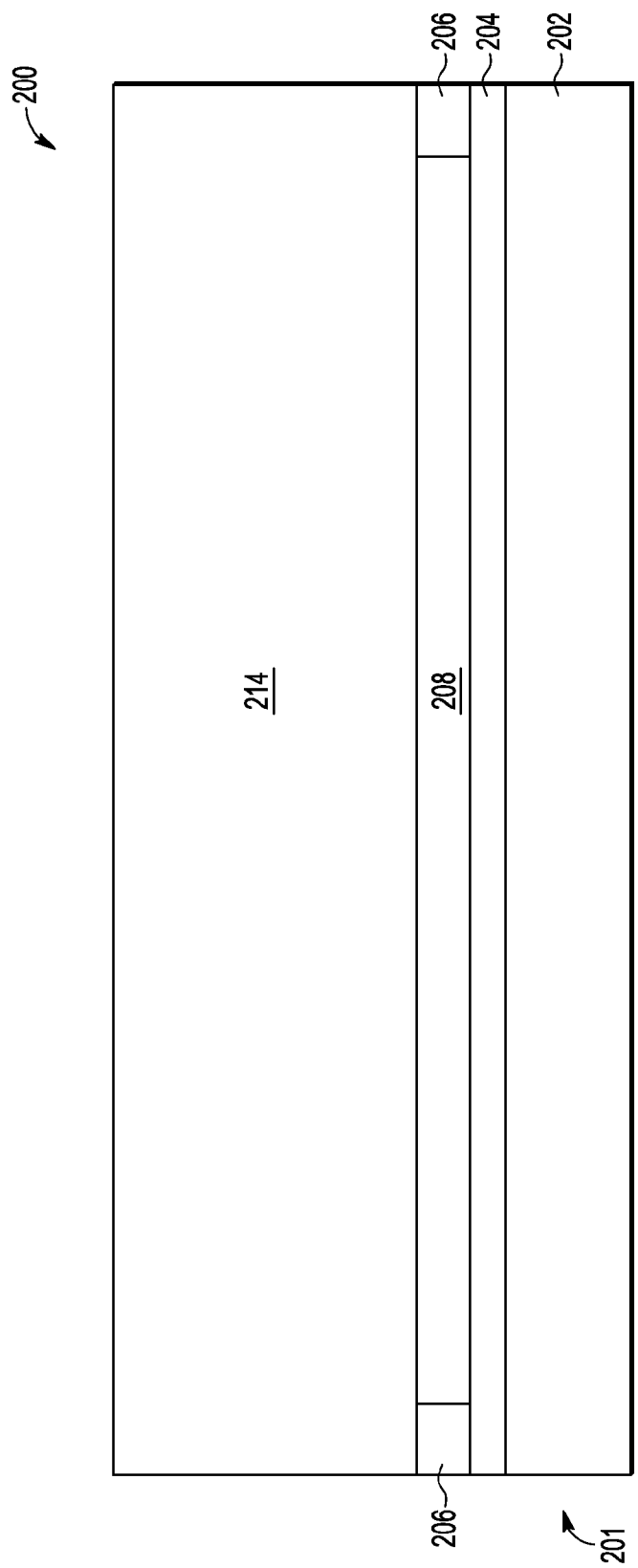

After forming the doped region 208, fabrication of the protection device structure 200 continues by removing the masking material 210 and forming or otherwise providing a doped region of semiconductor material having a desired thickness and a conductivity type opposite the doped region 208 overlying the doped region 208, resulting in the protection device structure 200 illustrated in FIG. 4. For example, a P-type epitaxial layer 214 may be formed by epitaxially growing silicon material on the seed layer 206 and in-situ doping the silicon material by adding boron ions (or other P-type ions) to the reactants used to epitaxially grow the layer 214. In one or more embodiments, the epitaxial layer 214 has a P-type dopant concentration in the range of about $1\times10^{15}/cm^3$ about $8\times10^{15}/cm^3$. In an exemplary embodiment, the epitaxial layer 214 is grown to a thickness in the range of about 3 microns to about 9 microns, which may vary depending on the needs of a particular application.

Figure 5:
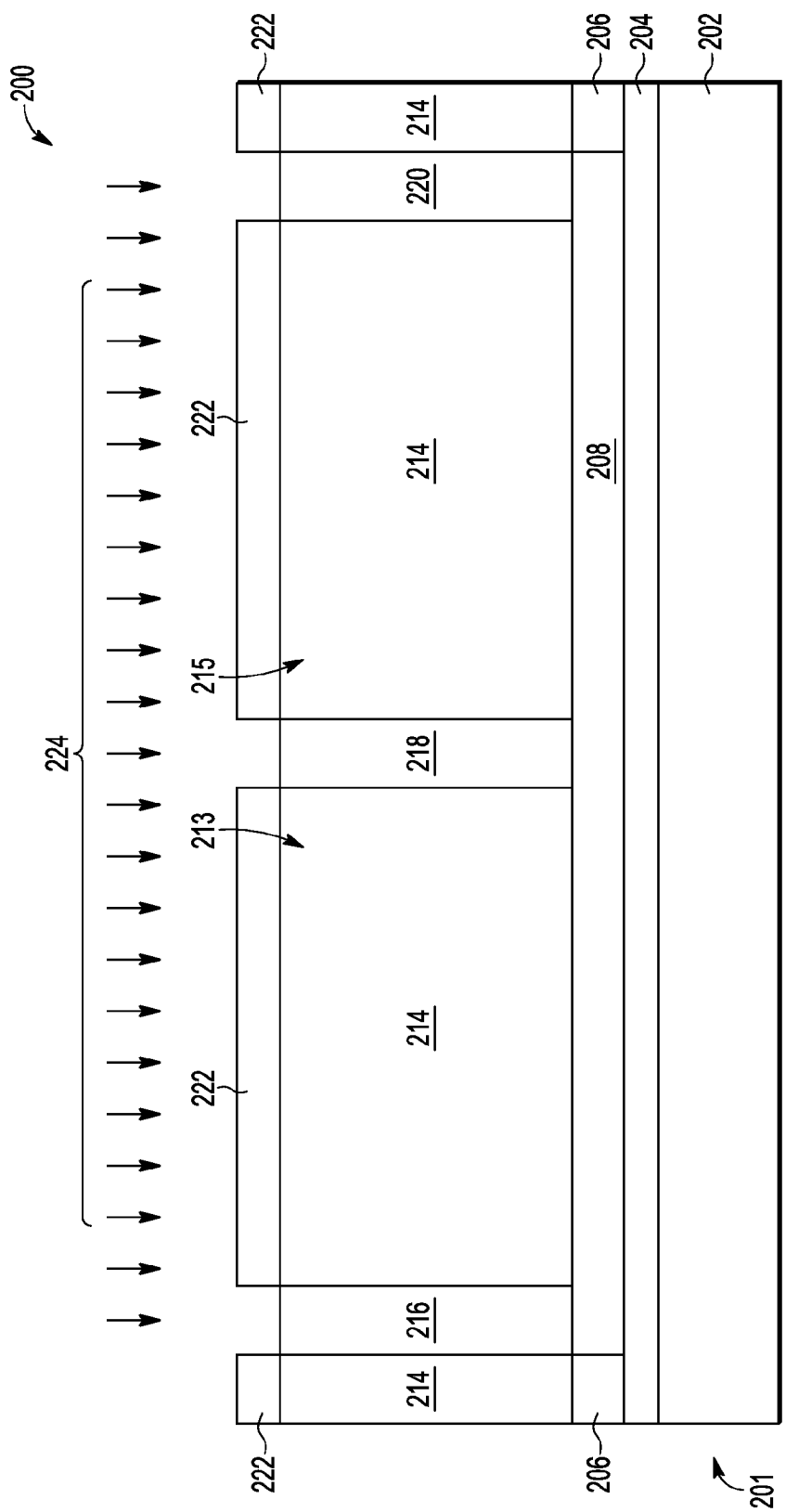

Turning now to FIG. 5, after forming the epitaxial layer 214, the fabrication process continues by masking portions of the epitaxial layer 214 and forming doped sinker regions 216, 218, 220 of semiconductor material having the opposite conductivity type within the epitaxial layer 214. The doped sinker regions 216, 218, 220 are formed by masking the protection device structure 200 with a masking material 222 that is patterned to provide an implantation mask that exposes an interior (or central) portion of the epitaxial layer 214 to be used for the interior doped sinker region 218 and peripheral portions of the epitaxial layer 214 to be used for peripheral doped sinker regions 216, 220 that abut subsequently formed deep trench isolation regions. For example, N-type sinker regions 216, 218, 220 are formed by implanting N-type ions, such as phorsphorous ions or arsenic ions, illustrated by arrows 224, in the epitaxial layer 214 with a dopant concentration in the range of about $1\times10^{16}/cm^3$ to about $1\times10^{19}/cm^3$, and more preferably within the range of $1\times10^{17}/cm^3$ to $1\times10^{18}/cm^3$, at an energy level in the range of about 2000 keV to about 3000 keV to provide N-type sinker regions 216, 218, 220 with a depth (after subsequent thermal annealing or any other diffusion) corresponding to the thickness of the epitaxial layer 214 so that the N-type sinker regions 216, 218, 220 extend to and abut the N-type buried region 208, thereby electrically connecting the N-type sinker regions 216, 218, 220 to the N-type buried region 208. As illustrated, the N-type sinker regions 216, 218, 220 partition the P-type epitaxial layer 214 into separate P-type regions 213, 215 having a respective bipolar junction transistor element (e.g., bipolar transistor element 120, 122) fabricated therein. For example, bipolar transistor element 120 may be fabricated in a first P-type region 215 and bipolar transistor element 122 may be fabricated in the second P-type region 213, as described in greater detail below.

Figure 6:
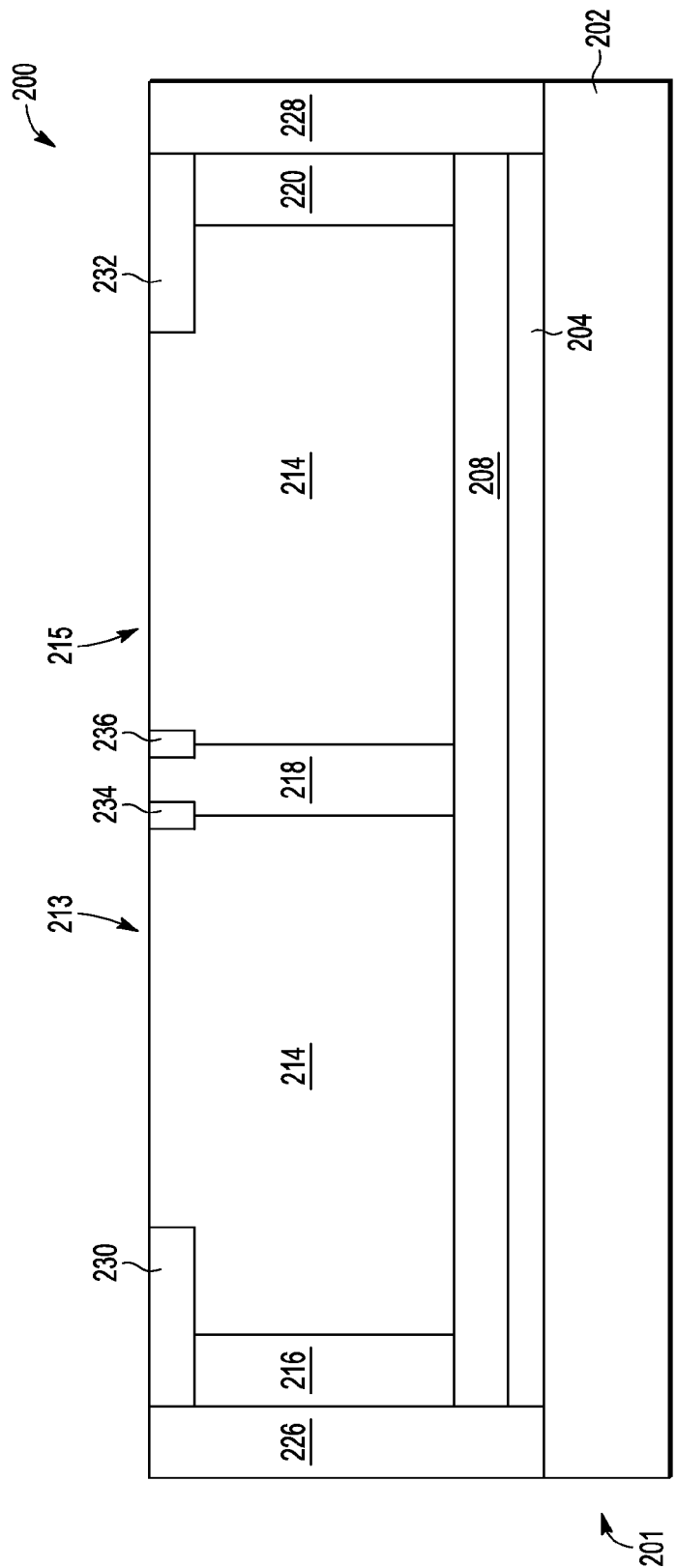

After forming the N-type sinker regions 216, 218, 220, the fabrication process continues by forming isolation regions, resulting in the protection device structure 200 illustrated in FIG. 6. In an exemplary embodiment, the fabrication process isolates the protection circuitry from adjacent semiconductor devices by performing deep trench isolation (DTI) to provide deep isolation regions 226, 228 of dielectric material. For example, to form deep isolation regions 226, 228, the interior portion of the protection device structure 200 is masked with a masking material that is subsequently patterned to expose the peripheral portions of the epitaxial layer 214 and seed layer 206, which are then etched until the buried layer 204 is exposed, and thereafter, a dielectric material, such as an oxide material, may be deposited in the trenches or grown on exposed surfaces of the trenches to fill the trenches, resulting in deep isolation regions 226, 228. After forming deep isolation regions 226, 228, the fabrication process continues by forming shallow isolation regions 230, 232, 234, 236 of a dielectric material in the upper portions of the N-type sinker regions 216, 218, 220 and adjacent portions of P-type epitaxial regions 213, 215 by performing shallow trench isolation (STI). To form the shallow isolation regions 230, 232, 234, 236, portions of the epitaxial layer 214 are masked with a masking material that is patterned to expose the peripheral N-type sinker regions 216, 220, portions of the interior sinker region 218 adjacent to the epitaxial layer 214 (while leaving the central portion of the interior sinker region 218 masked), and portions of the P-type epitaxial regions 213, 215 adjacent to the N-type sinker regions 216, 218, 220 so that the shallow isolation regions 230, 232, 234, 236 are formed overlying portions of the epitaxial layer 214 adjacent to the N-type sinker regions 216, 218, 220. The exposed portions of the N-type sinker regions 216, 218, 220 and adjacent portions of the P-type epitaxial layer 214 are then etched to a desired depth (which is less than the thickness of the epitaxial layer 214), and a dielectric material, such as an oxide material, may be deposited to fill the trenches, resulting in shallow isolation regions 230, 232, 234, 236. In accordance with one or more exemplary embodiments, the depth of the shallow isolation regions 230, 232, 234, 236 is in the range of about 0.05 microns to about 1 micron, and more preferably, within the range of 0.2 microns to 0.5 microns. In the illustrated embodiment, the shallow isolation regions 230, 232, 234, 236 extend laterally beyond the vertical boundaries of the N-type sinker regions 216, 218, 220 to prevent the N-type sinker regions 216, 218, 220 from influencing the triggering voltage of the protection device structure 200, as described in greater detail below.

Figure 7:
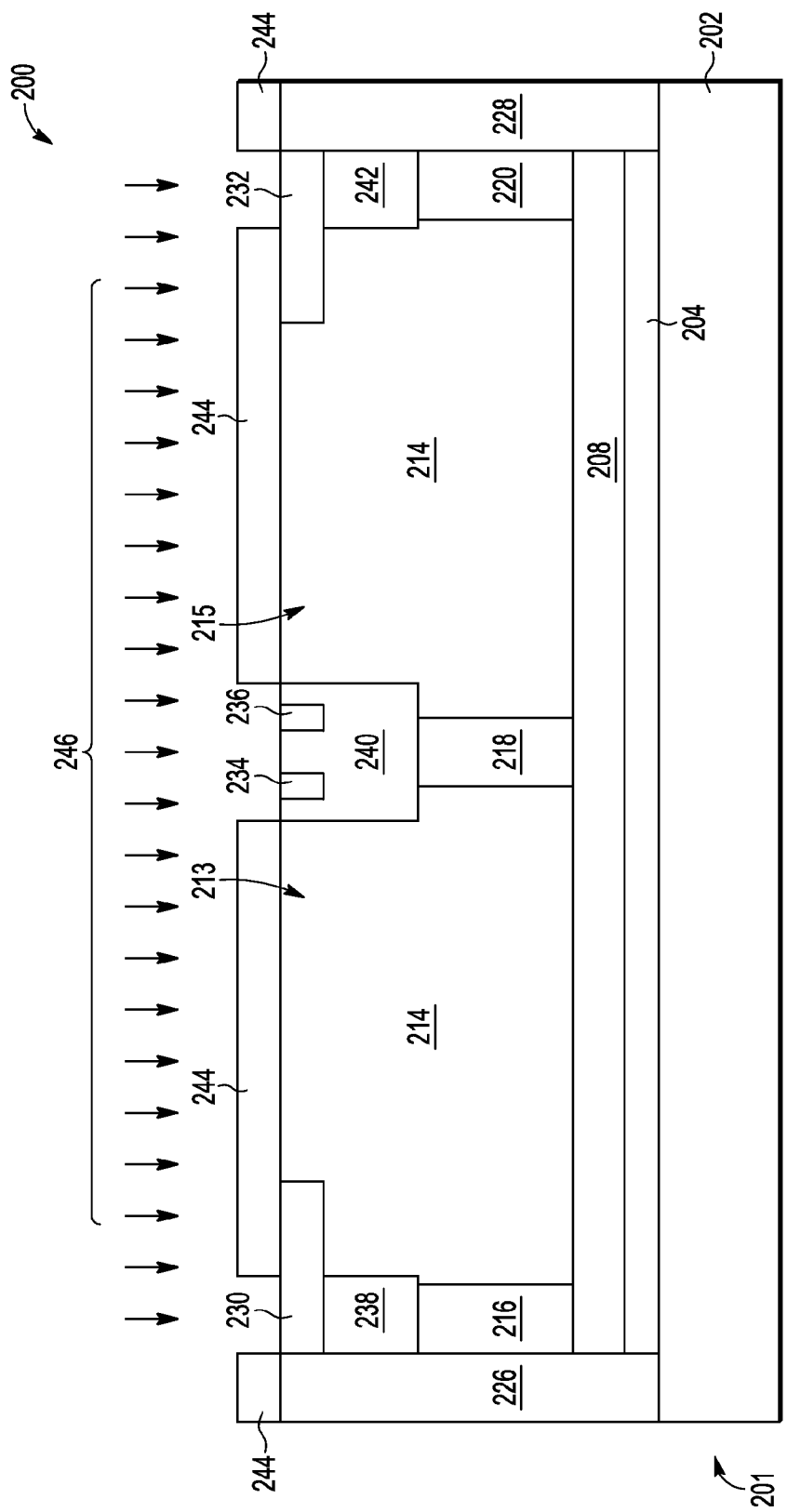

Turning now to FIG. 7, after forming the deep and shallow isolation regions, fabrication of the protection device structure 200 continues by masking interior portions of the P-type epitaxial regions 213, 215 and forming N-type well regions 238, 240, 242 within the N-type sinker regions 216, 218, 220. The N-well regions 238, 240, 242 are formed by masking the protection device structure 200 with a masking material 244 that is patterned to provide an implantation mask that exposes the sinker regions 216, 218, 220. As illustrated, the remaining masking material 244 masks the deep trench isolation regions 226, 228 and interior portions of the P-type epitaxial regions 213, 215 while the lateral edges of the implantation mask are offset from the boundaries of the P-type epitaxial regions 213, 215 with a respective sinker region 216, 218, 220 so that the subsequently formed N-well regions 238, 240, 242 extend laterally from a respective sinker region 216, 218, 220. In other words, the lateral width of the N-well regions 238, 240, 242 is greater than the lateral width of the N-type sinker regions 216, 218, 220. The N-well regions 238, 240, 242 are then formed by implanting N-type ions, such as phorsphorous ions or arsenic ions, illustrated by arrows 246, in the epitaxial layer 214 with a dopant concentration that is less than or equal to the dopant concentration of the N-type sinker regions 216, 218, 220, preferably within the range of about $1\times10^{16}/cm^3$ to about $1\times10^{18}/cm^3$, and at an energy level in the range of about 1000 keV to about 2000 keV to provide the N-well regions 238, 240, 242 with a depth (after subsequent thermal annealing or any other diffusion) that is greater than a depth of the shallow isolation regions 230, 232, 234, 236 but less than a depth of the N-type sinker regions 216, 218, 220. In accordance with one or more exemplary embodiments, the depth of the N-well regions 238, 240, 242 is greater than 0.3 microns.

Figure 8:
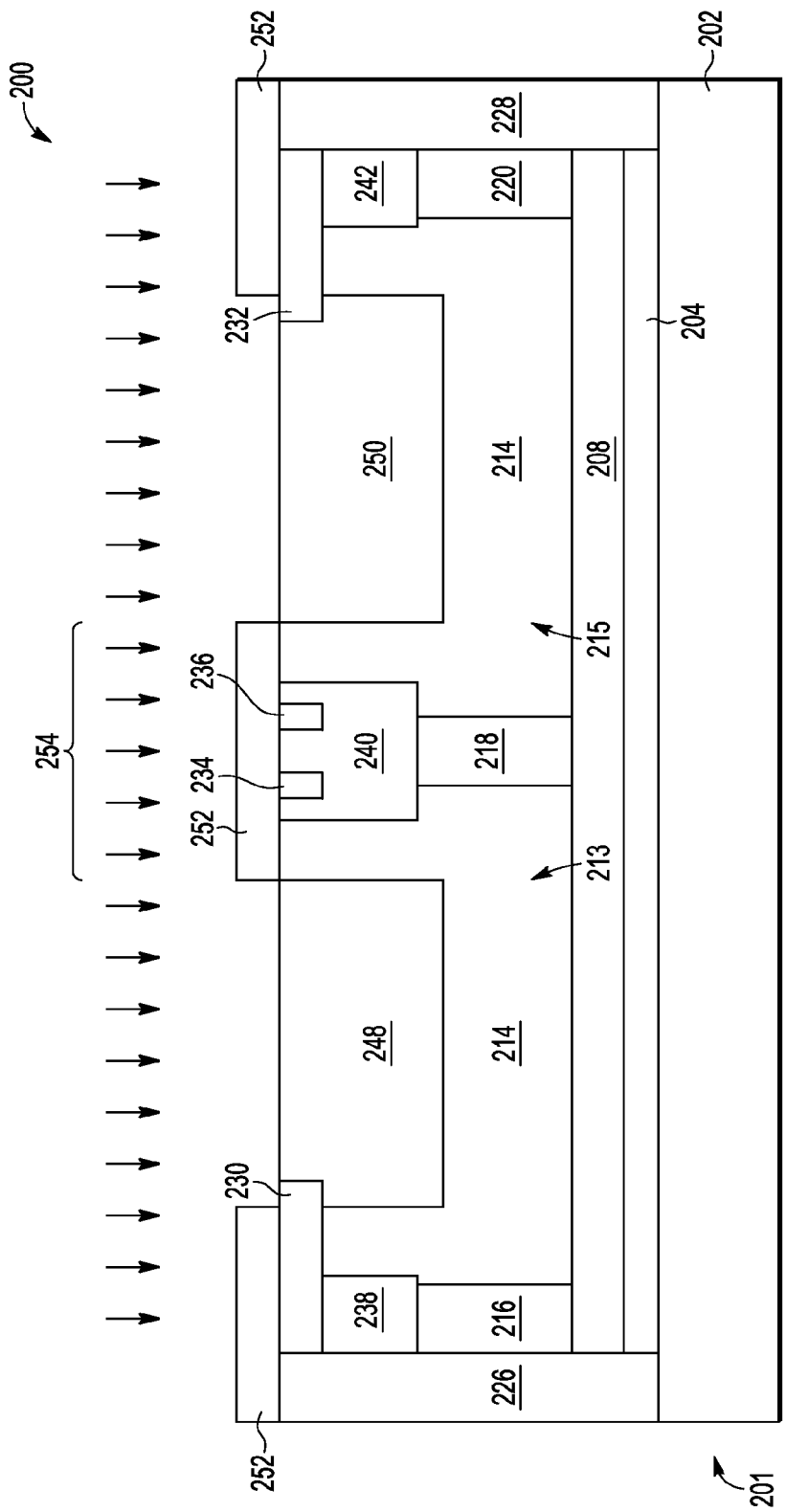

Turning now to FIG. 8, after forming the N-well regions 238, 240, 242, fabrication of the protection device structure 200 continues by masking the N-well regions 238, 240, 242 and forming P-type well regions 248, 250 in the interior portions of the P-type epitaxial regions 213, 215 between N-type sinker regions 216, 218, 220. To fabricate P-well regions 248, 250, the protection device structure 200 is masked with a masking material 252 that is patterned to provide an implantation mask that exposes interior portions of the P-type epitaxial regions 213, 215 while masking the N-well regions 238, 240, 242 and deep trench isolation regions 226, 228. In the illustrated embodiment of FIG. 8, the lateral edges of the implantation mask 252 are offset from the lateral boundaries of the peripheral shallow isolation regions 230, 232 to expose interior portions of the peripheral shallow isolation regions 230, 232 so that the subsequently formed P-well regions 248, 250 extend laterally beneath the shallow isolation regions 230, 232 to inhibit current flow to/from the N-well regions 238, 242. The P-well regions 248, 250 are then formed by implanting P-type ions, such as boron ions, illustrated by arrows 254, in the exposed interior portions of the epitaxial layer 214 with a dopant concentration that is greater than the dopant concentration of the P-type epitaxial regions 213, 215, preferably within the range of $1\times10^{16}/cm^3$ to about $1\times10^{19}/cm^3$, and at an energy level in the range of about 100 keV to about 500 keV to provide the P-well regions 248, 250 with a depth (after subsequent thermal annealing or any other diffusion) that is greater than a depth of the shallow isolation regions 230, 232 but less than the thickness of the epitaxial layer 214, so that at least a portion of the lighter doped P-type epitaxial layer 214 remains vertically between the P-well regions 248, 250 and the N-type buried region 208. In accordance with one or more exemplary embodiments, the depth of the P-well regions 248, 250 is greater than 0.3 microns. The P-well regions 248, 250 function as the base electrodes of the respective bipolar junction transistor elements (e.g., bipolar junction transistor elements 120, 122) of the protection device structure 200, as described in greater detail below.

Figure 9:
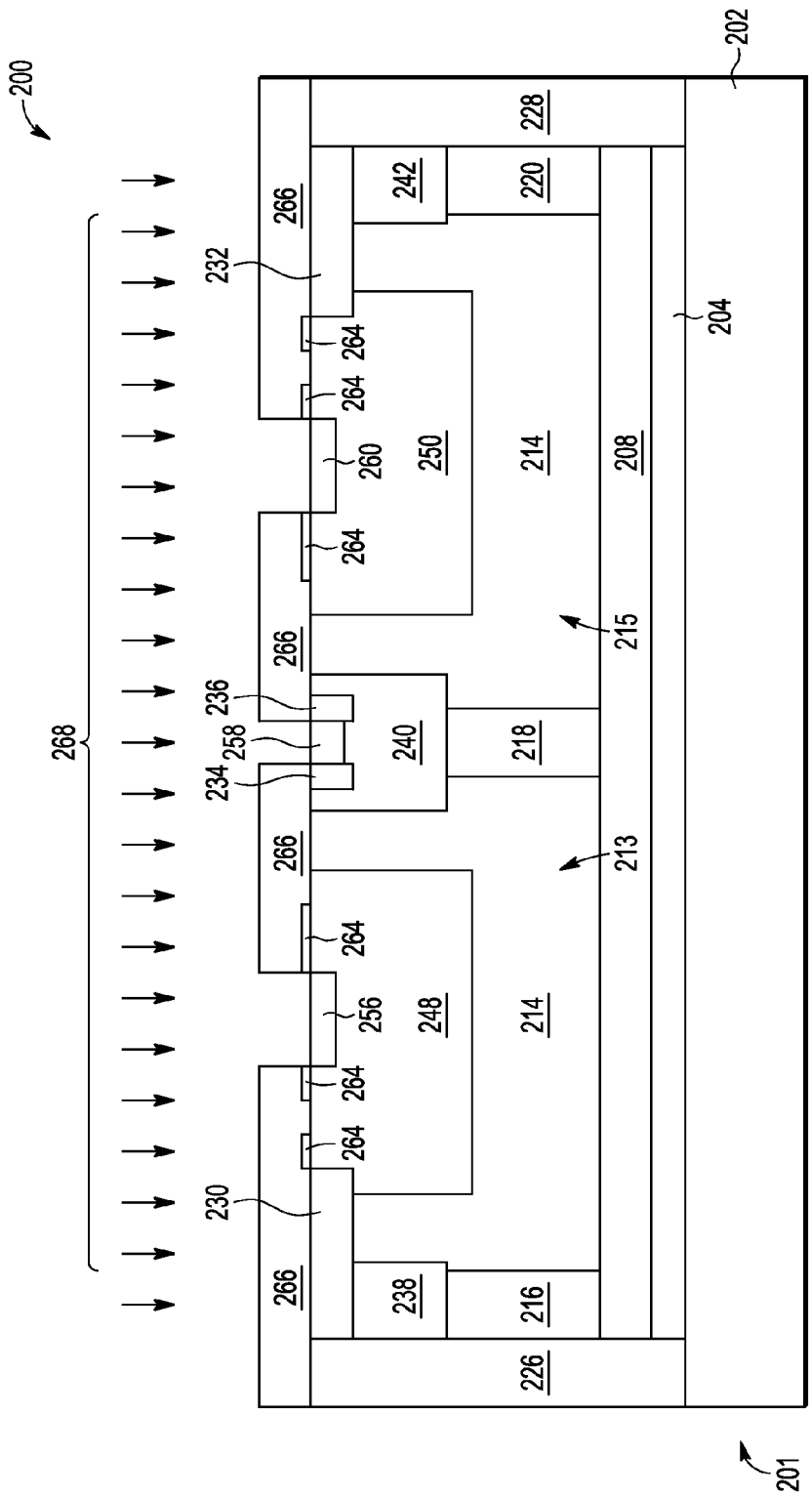
Figure 10:
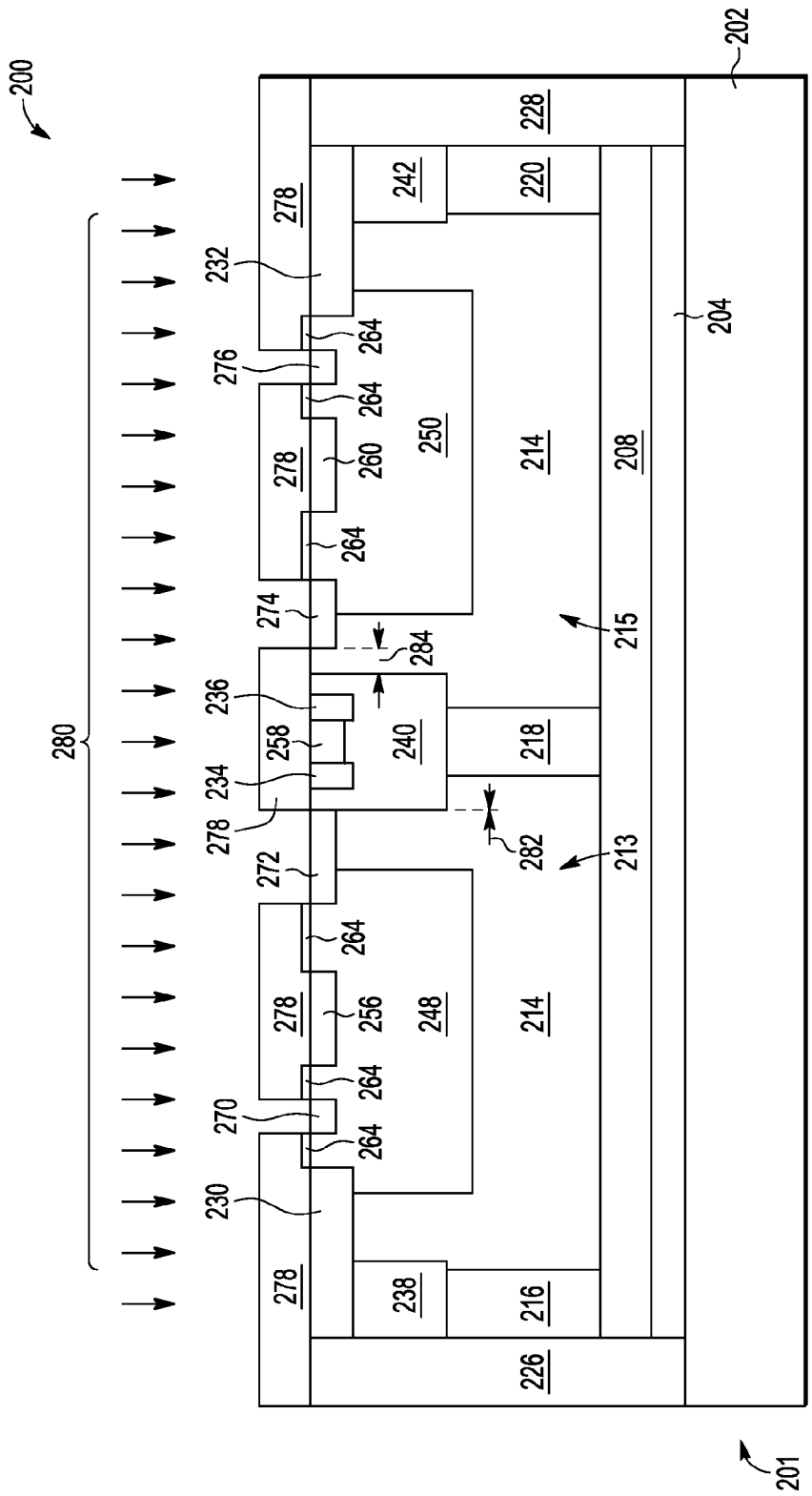

Referring now to FIGS. 9-10, after forming the P-well regions 248, 250, the fabrication process continues by appropriately masking the protection device structure 200, forming shallow N-type regions 256, 258, 260 within the P-well regions 248, 250 and the interior N-well region 240, and forming shallow P-type regions 270, 272, 274, 276 within the P-well regions 248, 250. The N-type regions 256, 260 function as an emitter electrode for a respective bipolar junction transistor element (e.g., bipolar junction transistor elements 120, 122), N-type region 258 functions as a collector electrode contact region for the bipolar junction transistor elements, P-type regions 270, 276 function as base electrode contact regions for the respective bipolar junction transistor element, and P-type regions 272, 274 function as an anode for a respective zener diode element (e.g., zener diode elements 124, 126). In this regard, the N-type emitter region 260, the P-type base regions 250, 276 and the N-type buried collector region 208 function as the first bipolar junction transistor element (e.g., bipolar transistor element 120) of the protection device structure 200 while the second N-type emitter region 256, the second P-type base regions 248, 270 and the N-type buried collector region 208 function as the second bipolar junction transistor element (e.g., bipolar transistor element 122) of the protection device structure 200. The interior N-well region 240 functions as a cathode in combination with the P-type anode region 274 to provide the zener diode element (e.g., zener diode element 126) between base and collector electrodes of the first bipolar junction transistor element while the N-well region 240 also functions as a cathode in combination with the P-type anode region 272 to provide the zener diode element (e.g., zener diode element 124) between base and collector electrodes of the second bipolar junction transistor element. In this regard, the cathodes of the zener diode elements may be realized using a common doped region. It should be noted, however, that the subject matter described herein is not limited to zener diode elements having a common or shared cathode region. For example, in alternative embodiments, either and/or both of the peripheral N-well regions 238, 242 may be utilized as the cathode of a respective zener diode element (e.g., by forming the respective P-type anode region in the peripheral portion of the respective P-well region 248, 250 proximate the respective peripheral N-well region 238, 242).

In exemplary embodiments, prior to forming the shallow N-type and P-type regions, spaced apart silicide blocking regions 264 are formed overlying the P-well regions 248, 250. In this regard, the silicide blocking regions 264 prevent subsequent formation of silicide material on the portions of the P-well regions 248, 250 between neighboring shallow N-type and P-type regions. The silicide blocking regions 264 include one or more silicide blocking materials, such as, one or more oxide materials and/or one or more nitride materials. For example, in one embodiment, the silicide blocking regions 264 are formed by forming a layer of oxide material (which may function as a gate dielectric for other devices on the wafer), forming a layer of nitride material overlying the oxide material, and etching the oxide and nitride materials to expose the portions of the P-well regions 248, 250 to be used for the shallow N-type and P-type regions while the remaining silicide blocking material overlying the P-well regions 248, 250 remains intact. After forming the silicide blocking regions 264, the shallow N-type regions 256, 258, 260 are formed by masking the protection device structure 200 with a masking material 266 that is patterned to expose the central portions of the P-well regions 248, 250 and the central portion of the interior N-well region 240 between shallow isolation regions 234, 236, as illustrated by FIG. 9. The shallow N-type regions 256, 258, 260 are then formed by implanting N-type ions, such as phosphorous ions or arsenic ions, illustrated by arrows 268, in the exposed interior portions of regions 240, 248, 250 with a dopant concentration in the range of about $1 \times 10^{19}/cm^3$ to about $1 \times 10^{21}/cm^3$ and at an energy level in the range of about 20 keV to about 100 keV to provide the N-type regions 256, 258, 260 with a depth (after diffusion) that is less than a depth of the shallow isolation regions 230, 232, 234, 236. For example, in accordance with one or more embodiments, the depth of the shallow N-type regions 256, 258, 260 is in the range of about 0.05 microns to about 0.3 microns.

Referring to FIG. 10, in a similar manner, the shallow P-type regions 270, 272, 274, 276, are formed by masking the protection device structure 200 with a masking material 278 that is patterned to expose the portions of the P-well regions 248, 250 proximate the interior N-well region 240 and portions of the P-well regions 248, 250 between the shallow N-type regions 256, 260 and the shallow isolation regions 234, 236. After the masking material 278 is patterned, the shallow P-type regions 270, 272, 274, 276 are formed by implanting P-type ions, such as boron ions, illustrated by arrows 280, in the exposed portions of the P-well regions 248, 250 and P-type epitaxial regions 213, 215 with a dopant concentration in the range of about $1 \times 10^{19}/cm^3$ to about $1 \times 10^{21}/cm^3$ and at an energy level in the range of about 2 keV to about 50 keV to provide the P-type regions 270, 272, 274, 276 with a depth (after diffusion) that is less than a depth of the shallow isolation regions 230, 232, 234, 236 (e.g., in the range of about 0.05 microns to about 0.3 microns).

As illustrated in FIG. 10, the lateral edges of the implantation mask are offset from the lateral boundaries of the P-well regions 248, 250 proximate the interior N-well region 240 so that the P-type anode regions 272, 274 formed in the P-well regions 248, 250 proximate the N-well region 240 extend laterally beyond the P-well regions 248, 250 into the portions of P-type epitaxial regions 213, 215 disposed laterally between a respective P-well region 248, 250 and a respective N-well region 240. In other words, while a least a portion of the P-type anode regions 272, 274 is formed within and electrically connected to a respective P-type base electrode well region 248, 250, at least a portion of a respective P-type anode region 272, 274 is formed in the portion of the P-type epitaxial region 213, 215 between a respective P-well region 248, 250 and the interior N-well region 240. As a result, the separation distance 282, 284 between a respective P-type anode region 272, 274 and the interior N-well region 240 is less than the separation distance between a respective P-well region 248, 250 and the interior N-well region 240. The lateral spacing 282 between the lateral extension of the P-type anode region 272 beyond the P-well region 248 and the lateral extension of the N-well region 240 beyond the shallow isolation region 234 controls the avalanche breakdown (or reverse bias) voltage of the second zener diode element (e.g., second zener diode element 124) while the lateral spacing 284 between the P-type anode region 274 and the N-well region 240 controls the avalanche breakdown (or reverse bias) voltage of the first zener diode element (e.g., first zener diode element 126). In this regard, the lateral spacing 282, 284 controls the proportion of the current that flows through a respective bipolar junction transistor element after the applied voltage exceeds a triggering voltage for the protection device structure 200. For example, increasing the separation distance 282 between the P-type anode region 272 and the N-well region 240 decreases the amount of current that flows through the portion of the P-type epitaxial region 213 between the regions 240, 272. Reducing the separation distance 282, 284 between a respective P-type anode region 272, 274 and the N-well region 240 reduces the reverse bias voltage of the respective zener diode element (and thereby reduces the triggering voltage of the protection device structure 200 in that polarity direction) but increases the snapback voltage relative to the triggering voltage (or alternatively, reduces the voltage difference between the triggering voltage in the snapback voltage). Conversely, increasing the separation distance 282, 284 between a respective P-type anode region 272, 274 and the N-well region 240 increases the reverse bias voltage of the respective zener diode element (and thereby increases the triggering voltage of the protection device structure 200 in that polarity direction) but also increases the voltage difference between the triggering voltage and the snapback voltage. In accordance with one or more embodiments, to provide the protection device structure 200 exhibiting non-snapback behavior in the forward direction, the separation distance 282 between the P-type anode region 272 and the N-well region 240 is substantially equal to zero and the separation distance 284 between the P-type anode region 274 and the N-well region 240 is less than or equal to about 1 micron, resulting in a forward snapback voltage substantially equal to the forward triggering voltage for the protection device structure 200. In this regard, the P-type anode region 272 may abut or otherwise contact the N-well region 240, as illustrated in FIG. 10.

Figure 11:
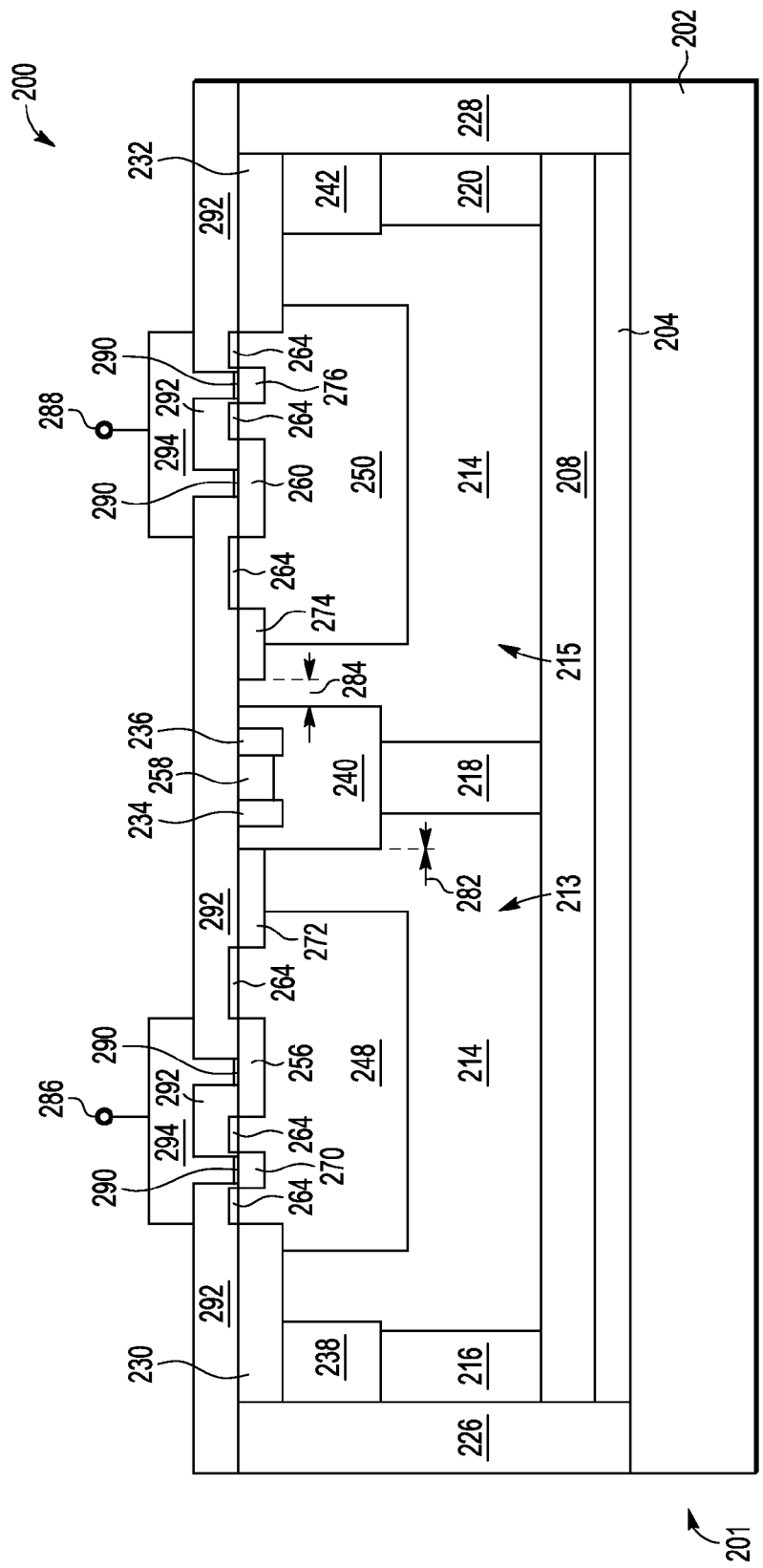

Turning now to FIG. 11, after forming the shallow N-type and P-type regions, fabrication of the protection device structure 200 may be completed by forming contacts 290 on the base and emitter electrode regions 256, 260, 270, 276, providing electrical connections between the respective base and emitter electrode regions 256, 260, 270, 276 of the respective bipolar junction transistor elements, and providing electrical connections between the base and emitter electrodes of the respective bipolar junction transistor elements and the respective physical interfaces 286, 288 of the electronic device that includes the protection device structure 200. The contacts 290 may be realized as a metal silicide layer formed by conformably depositing a layer of silicide-forming metal onto the exposed surfaces of the base and emitter electrode regions 256, 260, 270, 276 and heating the protection device structure 200, for example by rapid thermal annealing (RTA), to react the silicide-forming metal with the exposed silicon and form the metal silicide layer 290 at the top of the electrode regions 256, 260, 270, 276 that are not masked by the silicide blocking regions 264. After the contacts 290 are formed, the fabrication process continues by forming a layer of dielectric material 292 overlying the protection device structure 200, removing portions of the dielectric material 292 overlying the base and emitter electrode regions 256, 260, 270, 276 to expose the contacts 290, and forming a conductive material 294 overlying the exposed base and emitter contacts 290. The dielectric material 292 may be realized as an interlayer dielectric material, such as an oxide material, that is conformably deposited overlying the protection device structure 200 in a conventional manner. Portions of the dielectric material 292 overlying the base and emitter electrode regions 256, 260, 270, 276 are removed by etching the dielectric material 292 using an anisotropic etchant to provide voided regions overlying the base and emitter contacts 290, and the conductive material 294 may be formed in the voided regions by conformably depositing a metal material overlying the protection device structure 200 to a thickness that is greater than or equal to the thickness of the dielectric material 292. The conductive material 294 may be patterned, routed, or otherwise formed to provide an electrical connection between the electrode regions 256, 260, 270, 276 of a respective bipolar junction transistor element and a respective physical interface 286, 288 of the electronic device.

Referring now to FIGS. 1 and 11, in exemplary embodiments, the protection circuitry 108 is realized as the protection device structure 200, wherein the first physical interface 288 is realized as the higher voltage terminal 102 (e.g., a positive reference voltage terminal, a supply voltage terminal, or the like) and the second physical interface 286 is realized as the lower voltage terminal 104 (e.g., a negative reference voltage terminal, a ground voltage terminal, or the like). In this regard, N-type region 260 functions as the emitter of the first bipolar transistor element 120, P-type region 276 (and P-well region 250) functions as the base of the first bipolar transistor element 120, and buried N-type region 208 functions as the collector of the first bipolar transistor element 120, while P-type region 274 functions as the anode of the first zener diode element 126 and the N-type well region 240 functions as the cathode of the first zener diode element 126. The N-type region 256 functions as the emitter of the second bipolar transistor element 122, P-type region 270 (and P-well region 248) functions as the base of the second bipolar transistor element 122, and buried N-type region 208 functions as the collector of the second bipolar transistor element 122, while P-type region 272 functions as the anode of the second zener diode element 124 and the N-type well region 240 functions as the cathode of the second zener diode element 124.

As described above, when the voltage at terminal 102, 288 relative to the voltage at terminal 104, 286 exceeds the forward triggering voltage (the sum of the forward bias voltage of the zener diode element 126 provided by regions 240, 274 and the reverse bias voltage of the zener diode element 124 provided by regions 240, 272) of the protection circuitry 108, the voltage of the base electrode 270 is raised relative to the emitter electrode 256 of the second bipolar transistor element 122 to turn on or otherwise activate the ESD clamp and dissipate current through the second bipolar transistor element 122 that prevents current resulting from an ESD event from flowing through the functional circuitry 106. Conversely, when the voltage at terminal 104, 286 exceeds the voltage at terminal 102, 288 by the reverse triggering voltage (the sum of the forward bias voltage of the zener diode element 124 provided by regions 240, 272 and the reverse bias voltage of the zener diode element 126 provided by regions 240, 274) of the protection circuitry 108, the voltage of the base electrode 276 is lowered relative to the emitter electrode 260 of the first bipolar transistor element 120 to turn on or otherwise activate the ESD clamp and dissipate current through the first bipolar transistor element 120 that prevents current resulting from an ESD event from flowing through the functional circuitry 106. As described above, increasing the separation distance 282 between the anode region 272 and cathode region 240 for the second diode element 124 increases the reverse bias voltage of the second diode element 124 (thereby increasing the triggering voltage), but may also increase the voltage difference between the triggering voltage and snapback voltage for the protection circuitry 108. In this regard, when the separation distance 282 is relatively small (e.g., less than about 1 micron), the voltage difference between the forward triggering voltage and forward snapback voltage for the protection circuitry 108 is substantially equal to zero and the protection circuitry 108 exhibits non-snapback behavior in the forward direction (e.g., positive voltages at terminal 102, 288 relative to terminal 104, 286). As the separation distance 282 is increased, the forward triggering voltage increases at a greater rate than the snapback voltage, thereby causing the protection circuitry 108 to begin exhibiting snapback behavior. In this regard, to increase the forward triggering voltage while maintaining non-snapback behavior, multiple instances of the protection device structure 200 may be stacked vertically and cascoded or otherwise coupled electrically in series between terminals 102, 104 (e.g., by coupling the emitter of bipolar transistor element 120 of one instance of the protection circuitry 108 to the emitter of bipolar transistor element 122 of another instance of the protection circuitry 108). The separation distance 284 may also be tuned to provide the desired reverse triggering voltage and/or non-snapback behavior in the reverse direction (e.g., positive voltages at terminal 104, 286 relative to terminal 102, 288). In this regard, the separation distance 284 may be greater than or otherwise different from the separation distance 282 to suit the needs of a particular application.

For the sake of brevity, conventional techniques related to semiconductor and/or integrated circuit fabrication, ESD protection schemes, and other functional aspects of the subject matter may not be described in detail herein. In addition, certain terminology may also be used herein for the purpose of reference only, and thus are not intended to be limiting. For example, the terms "first", "second" and other such numerical terms referring to structures do not imply a sequence or order unless clearly indicated by the context. The foregoing description also refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although a schematic shown in the figures may depict direct electrical connections between circuit elements and/or terminals, alternative embodiments may employ intervening circuit elements and/or components while functioning in a substantially similar manner.

In conclusion, systems, devices, and methods configured in accordance with example embodiments of the invention relate to:

An apparatus for protection circuit is provided. The protection circuit comprises a first bipolar junction transistor having a first collector, a first emitter, and a first base, a second bipolar junction transistor having a second collector, a second emitter, and a second base, the second collector being coupled to the first collector, a first diode having a first cathode and a first anode, the first cathode being coupled to the first collector and the first anode being coupled to the first base, and a second diode having a second cathode and a second anode, the second cathode being coupled to the second collector and the second anode being coupled to the second base. In one embodiment, the first emitter is coupled to the first base and the second emitter is coupled to the second base. In another embodiment, the protection circuit further comprises a first physical interface coupled to the first emitter and the first base, and a second physical interface coupled to the second emitter and the second base. In a further embodiment, the first bipolar junction transistor, the first diode, the second bipolar junction transistor and the second diode are encapsulated in a device package, the first physical interface comprises a higher voltage terminal of the device package, and the second physical interface comprises a lower voltage terminal of the device package. In exemplary embodiments, a separation distance between the second anode and the second cathode is less than or equal to one micron. In one embodiment, the second anode abuts the second cathode. In one embodiment, a separation distance between the second anode and the second cathode is less than a separation distance between the first anode and the first cathode. In yet another embodiment, the first collector and the second collector comprise a common doped region. In one embodiment, the protection circuit further comprises a sinker region underlying and abutting the first cathode, the sinker region having a same conductivity type as the first cathode, wherein the first collector and the second collector comprise a buried region having the same conductivity type underlying the sinker region, and the sinker region abuts the buried region. In yet another embodiment, the first cathode and the second cathode comprise a common doped region. In another embodiment, a separation distance between the second anode and the second cathode is not equal to a separation distance between the first anode and the first cathode.

In another embodiment, a method of fabricating a protection device structure on a semiconductor substrate is provided. The method comprises forming a first bipolar junction transistor on the semiconductor substrate, forming a second bipolar junction transistor on the semiconductor substrate, the second bipolar junction transistor having a second collector coupled to a first collector of the first bipolar junction transistor, forming a first diode on the semiconductor substrate, the first diode having a first cathode coupled to the first collector and a first anode coupled to a first base of the first bipolar junction transistor, and forming a second diode on the semiconductor substrate, the second diode having a second cathode coupled to the second collector and a second anode coupled to a second base of the second bipolar junction transistor. In one embodiment, forming the first diode comprises forming at least a portion of the first anode within the first base, and forming the second diode comprises forming at least a portion of the second anode within the second base. In a further embodiment, forming the second diode comprises forming the second anode extending from the second base such that a separation distance between the second anode and the second cathode is less than or equal to one micron. In one embodiment, the method further comprises providing a first electrical connection between a first emitter of the first bipolar junction transistor and a first package interface and providing a second electrical connection between a second emitter of the second bipolar junction transistor and a second package interface. In yet another embodiment, forming the first bipolar junction transistor comprises forming a first well region having a first conductivity type within a first region having the first conductivity type overlying a buried region having a second conductivity type and forming a first emitter region having the second conductivity type within the first well region, forming the second bipolar junction transistor comprises forming a second well region having the first conductivity type within a second region having the first conductivity type overlying the buried region and forming a second emitter region having the second conductivity type within the second well region, and forming the first diode comprises forming a third well region having the second conductivity type laterally between the first region and the second region and forming a first anode region having the first conductivity type within the first well region proximate the third well region, the first anode region extending laterally into the first region between the first well region and the third well region. In a further embodiment, forming the second diode comprises forming a second anode region having the first conductivity type within the second well region proximate the third well region, the second anode region extending laterally into the second region between the second well region and the third well region.

In yet another embodiment, an apparatus for a protection device structure is provided. The protection device structure comprises a buried region of semiconductor material having a first conductivity type, an epitaxial layer of semiconductor material having a second conductivity type overlying the buried region, a first well region having the second conductivity type within the epitaxial layer, a first emitter region having the first conductivity type within the first well region, a second well region within the epitaxial layer, a second emitter region having the first conductivity type within the second well region, a third well region having the first conductivity type coupled to the buried region, a first anode region having the second conductivity type within a first portion of the epitaxial layer between the third well region and the first well region, wherein the first anode region abuts the first well region, and a second anode region having the second conductivity type within a second portion of the epitaxial layer, wherein the second anode region abuts the second well region. In one embodiment, the second portion of the epitaxial layer is between the third well region and the second well region. In another embodiment, the second anode region abuts the third well region.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. Accordingly, details of the exemplary embodiments or other limitations described above should not be read into the claims absent a clear intention to the contrary.

What is claimed is:

1. A protection circuit comprising:
 a first bipolar junction transistor having a first collector, a first emitter, and a first base;
 a second bipolar junction transistor having a second collector, a second emitter, and a second base, the second collector being coupled to the first collector;
 a first diode having a first cathode and a first anode, the first cathode being coupled to the first collector and the first anode being coupled to the first base; and
 a second diode having a second cathode and a second anode, the second cathode being coupled to the second collector and the second anode being coupled to the second base, wherein:
   the second cathode comprises a cathode region of semiconductor material having a first conductivity type;

the second anode comprises a second anode region of semiconductor material having a second conductivity type; and a separation distance between the cathode region and the second anode region provides non-snapback behavior in a first polarity direction.

2. The protection circuit of claim 1, further comprising:
a first physical interface coupled to the first emitter and the first base; and
a second physical interface coupled to the second emitter and the second base.

3. The protection circuit of claim 2, wherein:
the first bipolar junction transistor, the first diode, the second bipolar junction transistor and the second diode are encapsulated in a device package;
the first physical interface comprises a higher voltage terminal of the device package; and
the second physical interface comprises a lower voltage terminal of the device package.

4. The protection circuit of claim 3, wherein a separation distance between the second anode and the second cathode is less than or equal to one micron to provide the non-snapback behavior in the first polarity direction from the higher voltage terminal to the lower voltage terminal.

5. The protection circuit of claim 4, wherein the second anode abuts the second cathode.

6. The protection circuit of claim 3, wherein a separation distance between the second anode and the second cathode is less than a separation distance between the first anode and the first cathode to provide the non-snapback behavior in the first polarity direction from the higher voltage terminal to the lower voltage terminal.

7. The protection circuit of claim 1, wherein the first collector and the second collector comprise a common doped region.

8. The protection circuit of claim 7, further comprising a sinker region underlying and abutting the cathode region, the sinker region having the first conductivity type, wherein:
the first collector and the second collector comprise a buried region having the first conductivity type underlying the sinker region; and
the sinker region abuts the buried region.

9. The protection circuit of claim 1, wherein the first cathode and the second cathode comprise a common doped region, the common doped region comprising the cathode region.

10. The protection circuit of claim 1, wherein a separation distance between the second anode and the second cathode is not equal to a separation distance between the first anode and the first cathode.

11. The protection circuit of claim 1, wherein the second anode region abuts the cathode region.

12. A method of fabricating a protection device structure on a semiconductor substrate, the method comprising:
forming a first bipolar junction transistor on the semiconductor substrate;
forming a second bipolar junction transistor on the semiconductor substrate, the second bipolar junction transistor having a second collector coupled to a first collector of the first bipolar junction transistor;
forming a first diode on the semiconductor substrate, the first diode having a first cathode coupled to the first collector and a first anode coupled to a first base of the first bipolar junction transistor; and
forming a second diode on the semiconductor substrate, the second diode having a second cathode coupled to the second collector and a second anode coupled to a second base of the second bipolar junction transistor, wherein forming the second diode comprises forming the second anode within a separation distance of the second cathode, the separation distance resulting in the protection device structure exhibiting a non-snapback behavior in a first polarity direction.

13. The method of claim 12, wherein:
forming the first diode comprises forming at least a portion of the first anode within the first base; and
forming the second diode comprises forming at least a portion of the second anode within the second base.

14. The method of claim 13, wherein forming the second diode comprises forming the second anode extending from the second base such that a separation distance between the second anode and the second cathode is less than or equal to one micron.

15. The method of claim 12, further comprising:
providing a first electrical connection between a first emitter of the first bipolar junction transistor and a first package interface; and
providing a second electrical connection between a second emitter of the second bipolar junction transistor and a second package interface.

16. The method of claim 12, wherein:
forming the first bipolar junction transistor comprises:
forming a first well region having a first conductivity type within a first region having the first conductivity type overlying a buried region having a second conductivity type; and
forming a first emitter region having the second conductivity type within the first well region;
forming the second bipolar junction transistor comprises:
forming a second well region having the first conductivity type within a second region having the first conductivity type overlying the buried region; and
forming a second emitter region having the second conductivity type within the second well region; and
forming the first diode comprises:
forming a third well region having the second conductivity type laterally between the first region and the second region; and
forming a first anode region having the first conductivity type within the first well region proximate the third well region, the first anode region extending laterally into the first region between the first well region and the third well region.

17. The method of claim 16, wherein forming the second diode comprises forming a second anode region having the first conductivity type within the second well region proximate the third well region, the second anode region extending laterally into the second region between the second well region and the third well region.

18. A protection device structure comprising:
a buried region of semiconductor material having a first conductivity type;
an epitaxial layer of semiconductor material having a second conductivity type overlying the buried region;
a first well region having the second conductivity type within the epitaxial layer;
a first emitter region having the first conductivity type within the first well region;
a second well region within the epitaxial layer;
a second emitter region having the first conductivity type within the second well region;
a third well region having the first conductivity type coupled to the buried region;

a first anode region having the second conductivity type within a first portion of the epitaxial layer between the third well region and the first well region, wherein the first anode region abuts the first well region; and a second anode region having the second conductivity type within a second portion of the epitaxial layer, wherein:
   the second anode region abuts the second well region; and
   the second anode region abuts the third well region.

19. The protection device structure of claim 18, wherein the second portion of the epitaxial layer is between the third well region and the second well region.

20. The protection device structure of claim 18, further comprising a sinker region having the first conductivity type underlying and abutting the third well region, wherein:
   a dopant concentration of the third well region is less than a dopant concentration of the sinker region;
   the sinker region resides laterally between the first well region and the second well region; and
   the sinker region overlies and abuts the buried region.

* * * * *